United States Patent [19]

Barnaby et al.

[11] Patent Number: 5,491,703
[45] Date of Patent: Feb. 13, 1996

[54] CAM WITH ADDITIONAL ROW CELLS CONNECTED TO MATCH LINE

[75] Inventors: Catherine L. Barnaby, Coalpit Heath; Richard J. Gammack, St. James; Anthony I. Stansfield, Hotwells, all of United Kingdom

[73] Assignee: SGS-Thomson Microelectronics Ltd., United Kingdom

[21] Appl. No.: 84,566

[22] Filed: Jun. 29, 1993

[30]  Foreign Application Priority Data

Jun. 30, 1992 [GB]  United Kingdom ............... 9213821

[51] Int. Cl.⁶ .................................................. H03M 13/00
[52] U.S. Cl. .................................... 371/40.1; 365/49
[58] Field of Search ................................. 371/40.1–40.4; 365/200, 201, 49, 51, 45, 52, 189.01, 154, 185, 227, 228, 53; 307/201, 530, 464; 257/372, 391–394, 401, 544, 484, 630, 652

[56]  References Cited

U.S. PATENT DOCUMENTS

| | | | |
|---|---|---|---|
| 4,755,974 | 7/1988 | Yamada et al. ............... | 365/49 |
| 5,043,943 | 8/1991 | Crisp et al. . | |
| 5,053,991 | 10/1991 | Burrows ....................... | 365/49 |
| 5,111,427 | 5/1992 | Kobayashi et al. .......... | 365/49 |
| 5,130,945 | 7/1992 | Hamamoto et al. .......... | 365/49 |
| 5,233,610 | 8/1993 | Nakayama et al. .......... | 371/40.1 |
| 5,245,617 | 9/1993 | DeSovza et al. ............. | 371/40.1 |
| 5,253,328 | 10/1993 | Hartman ....................... | 365/49 |
| 5,258,946 | 11/1993 | Graf ............................. | 365/49 |
| 5,311,462 | 5/1994 | Wells ............................ | 365/49 |

FOREIGN PATENT DOCUMENTS 2230882  10/1990  United Kingdom .

OTHER PUBLICATIONS

IBM Technical Disclosure Bulletin, vol. 13, No. 6, Nov. 1970, pp. 1657–1658, D. Bossen "Error Checking Means for Associative Memory Map", the whole document.

*Primary Examiner*—James P. Trammell
*Attorney, Agent, or Firm*—Felsman, Bradley, Gunter & Dillon

[57]  ABSTRACT

A method of accessing a content addressable memory having a plurality of RAM cells connected in an array of rows and columns, each row having a plurality of cells for storing a data word, at least one additional cell for storing a checking bit and a match line for providing a signal to indicate when a match occurs between an input data word and data stored in a row of cells, which method comprises storing in at least one row of cells a data word in data cells of the row and a checking bit in said at least one additonal cell of the row, the checking bit having a value dependent on the content of the data word in accordance with an error checking system, and controlling a memory accessing system to effect an associate operation by inputting to the columns of cells an input word with an input checking bit dependent on said input word in accordance with the same error checking system, comparing the input word and input checking bit with stored contents of each row of cells and in any row where a mismatch of the input data word with the stored data word occurs causing at least two cells in that row to change a signal level on a match line for that row, said memory accessing system being arranged to operate with a time delay for each associate operation which is less than that required for a single cell mismatch. The invention also provides a content addressable memory.

9 Claims, 5 Drawing Sheets

CAM WITH ADDITIONAL ROW CELLS CONNECTED TO MATCH LINE

The invention relates to a content addressable memory and to systems for accessing such a memory at high speed.

BACKGROUND OF THE INVENTION

Content addressable memories are known which comprise a plurality of RAM cells connected in an array of rows and columns. In addition to conventional read and write operations to cells in the memory array, a content addressable memory (CAM) permits an association operation in which a data word is input to the CAM and the contents of each row of RAM cells are tested to see if they hold the same data word. Each row of cells has a match line and if a match is found between the data word which is input and the contents of a row of cells then a signal is provided on the appropriate match line indicating the row where a match has been found. The data word which is input is normally applied to each row simultaneously and to all cells in each row simultaneously. Commonly a match line for each row which is to be subject to an association operation is precharged and the RAM cells in each row are arranged to discharge the match line if no match is found with the corresponding part of the input word. In this way the time taken to determine whether a match is found during an association operation depends on the time taken to discharge each match line where no match is found. Each row of cells may have a plurality of cells such as for example 32 bits where data is held in 32 bit words. A mismatch may arise from failure to match on a single cell in the 32 bit word. Consequently the time allocated to determine whether or not a match arises must be sufficient to handle the worst possible case where only one cell fails to provide a match in that particular row of cells.

It is an object of the present invention to provide an improved content addressable memory and system for accessing such a CAM where the speed of operation is improved.

SUMMARY OF THE INVENTION

The present invention provides a content addressable memory together with an accessing system, wherein the memory has a plurality of RAM cells connected in an array of rows and columns, a plurality of logic control circuits each connected to a respective column of cells, each logic circuit having data access circuitry to input or output data to the respective column of cells and mode control circuitry selectively operable to cause the logic control circuits to select between a write operation in which data input to the data access circuitry may be written to cells in the respective column of cells and an associate operation in which data which is input to the data access circuitry is compared with data stored in the respective column of cells to determine a match or a mismatch, each row of cells having a respective word line which may be activated to permit writing of data to cells in that row, and a respective match line connected to each cell in the row and to circuitry to establish a first signal level on the match line, each cell including circuitry connected to the respective match line and to the respective logic control circuit for changing the signal level on the match line to a second signal level during an associate operation if the data stored in the cell does not match the data input to the data access circuitry of the logic control circuit, wherein to increase the speed of operation during an associate operation each said row of cells includes a plurality of data cells for holding data and at least one additional cell holding a checking bit dependent on the data in the data cells such that when a mismatch occurs in only one data cell in a row a mismatch occurs for an additional cell in the row whereby at least two cells in the row operate to change the signal level on the match line, and said accessing system is arranged to access the memory with a time delay for each associate operation less than that required for a single cell mismatch.

The said additional cell may comprise a parity bit cell storing a value indicating the parity of the data word stored in the data cells of that row.

Alternatively a plurality of additional cells may be provided for each row, said additional cells string check bits determined according to an error correcting code for the data word stored in the data cells of that row.

The check bits may have bit locations distinct from data bit locations so that only selected bit portions are used to represent the data. Alternatively error correcting codes may be used which input a data word and generate a codeword having greater bit length than the input data word such that the codeword represents the data of the input data word and provides an increased minimum Hamming distance (the minimum Hamming distance representing the minimum number of bit locations by which any two different words will differ). Each row may contain such a codeword from an error correcting code, said codeword corresponding to a data word according to a known encoding rule such as a systematic encoding rule. An example is a BCH code with the particular code used defining the Hamming distance between any two codewords. A data item for look-up will be encoded according to the same error correcting code, and the resulting codeword will be compared to the codewords stored in the CAM. Such a code may be systematic in which the data bits to be encoded appear in the corresponding codeword according to a predefined pattern (e.g. same ordering in same set of places) but the code need not necessarily be systematic.

The present invention also provides a cache memory having a CAM as aforesaid and a data RAM having a plurality of rows of cells coupled to corresponding rows of said CAM.

The invention provides a method of accessing a content addressable memory having a plurality of RAM cells connected in an array of rows and columns, each row having a plurality of cells for storing an encoded data word, and a match line for providing a signal to indicate when a match occurs between an input word and an encoded data word stored in a row of cells, which method comprises encoding a data word by use of an error correcting code to form an encoded data word of greater bit length than the unencoded data word and having a greater minimum Hamming distance than the unencoded data word, storing in at least one row of cells said encoded word and effecting an associate operation by inputting to the columns of cells an input word which represents data encoded by the same error correcting code, comparing the input word with stored contents of each row of cells and in any row where a mismatch of the input word with the stored encoded data word occurs causing at least two cells in that row to change a signal level on a match line for that row, wherein an access time for each associate operation is controlled to be less than that required for a single cell mismatch.

The invention also provides a method of accessing a content addressable memory having a plurality of RAM cells connected in an array of rows and columns, each row having a plurality of cells for storing a data word, at least one additional cell for storing a checking bit and a match line for providing a signal to indicate when a match occurs between an input data word and data stored in a row of cells, which method comprises storing in at least one row of cells a data word in data cells of the row and a checking bit in said at least one additonal cell of the row, the checking bit having a value dependent on the content of the data word in accordance with an error checking system, and controlling a memory accessing system to effect an associate operation by inputting to the columns of cells an input word with an input checking bit dependent on said input word in accordance with the same error checking system, comparing the input word and input checking bit with stored contents of each row of cells and in any row where a mismatch of the input data word with the stored data word occurs causing at least two cells in that row to change a signal level on a match line for that row, said memory accessing system being arranged to operate with a time delay for each associate operation which is less than that required for a single cell mismatch.

DESCRIPTION OF THE PREFERRED EMBODIMENTS

Figure 1:
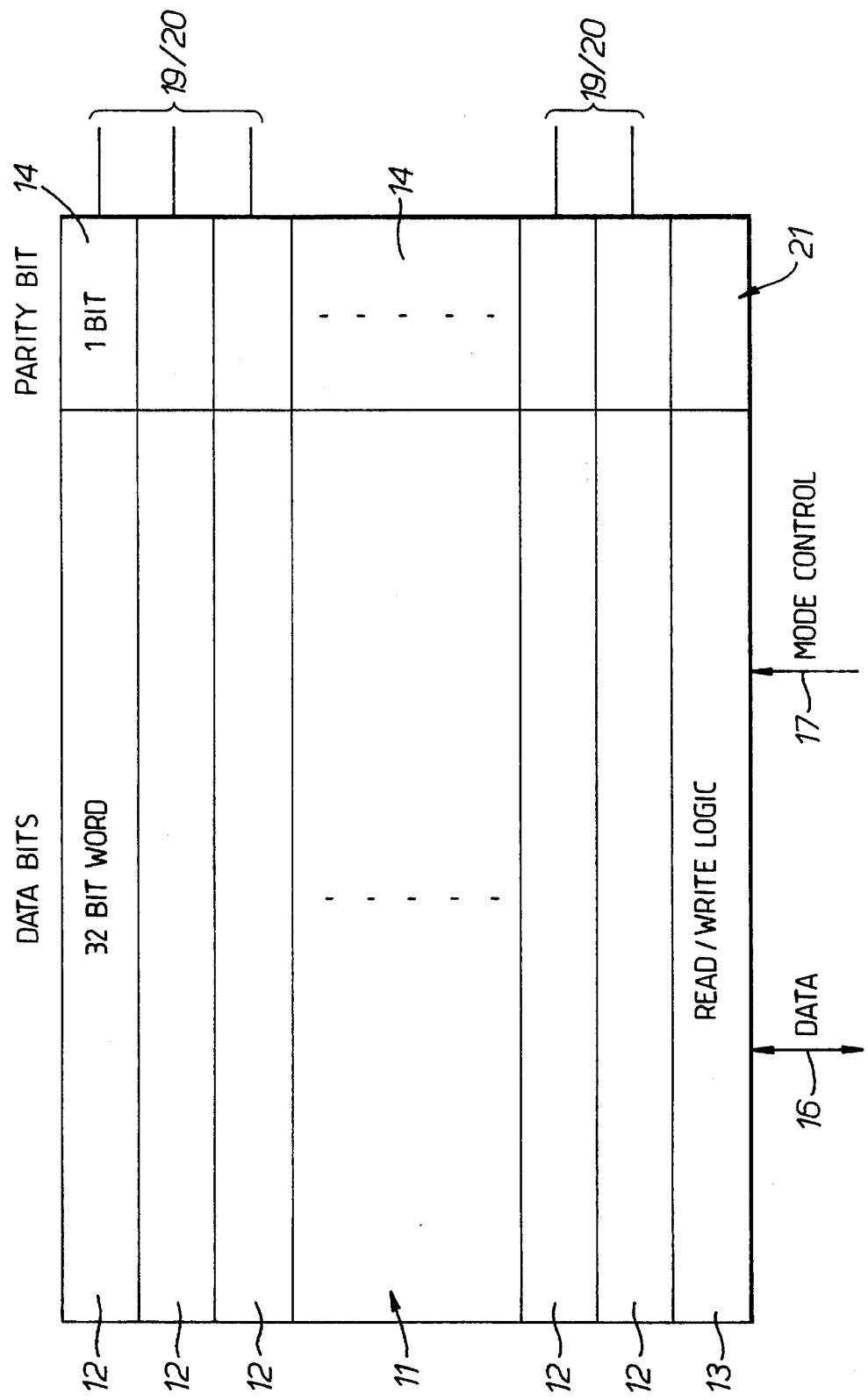
FIG. 1 is a block diagram of a content addressable memory in accordance with the present invention.

The example shown in FIG. 1 comprises a content addressable memory (CAM) having an array of RAM cells 11 arranged in rows and columns in conventional manner for a RAM. In this particular example each row 12 has 32 RAM cells arranged to hold a 32 bit word of data in each row. Each column of cells is controlled by read/write logic 13 coupled to the cells in the respective column. In this particular example each row of cells is extended by one cell to provide a parity bit 14 at the end of the row. The parity bit indicates the parity of the 32 bits of data held in the corresponding row of data bits. In this way each row stores an encoded data word in which an input data word is extended by a parity bit. In conventional manner for a content addressable memory, the read/write logic circuits 13 each have a data input and output 16 for read and write operations to the array of RAM cells. It also has mode control input circuitry 17 to select between read, write and associate operations. Each row of cells has a word line 19 which may be selectively precharged when it is required to read or write data using that row of cells. Each row also has a match line 20 arranged to provide an output during an associate operation to indicate whether or not a match is found between a data word input at 16 with the contents of the cells in any of the rows 12. When a data word is input at 16 it is encoded by the same encoding system to include a parity bit which is input to the column 21 of parity bit locations in addition to the bits forming the data words. In this way the associate operation tests for a match between the input data including the parity bit with the contents of each data word and its associated parity bit in the rows of CAM cells 12. A match is only provided on a match line 20 if a match is found in both the data bits and the parity bits of any row in the array.

Figure 3:
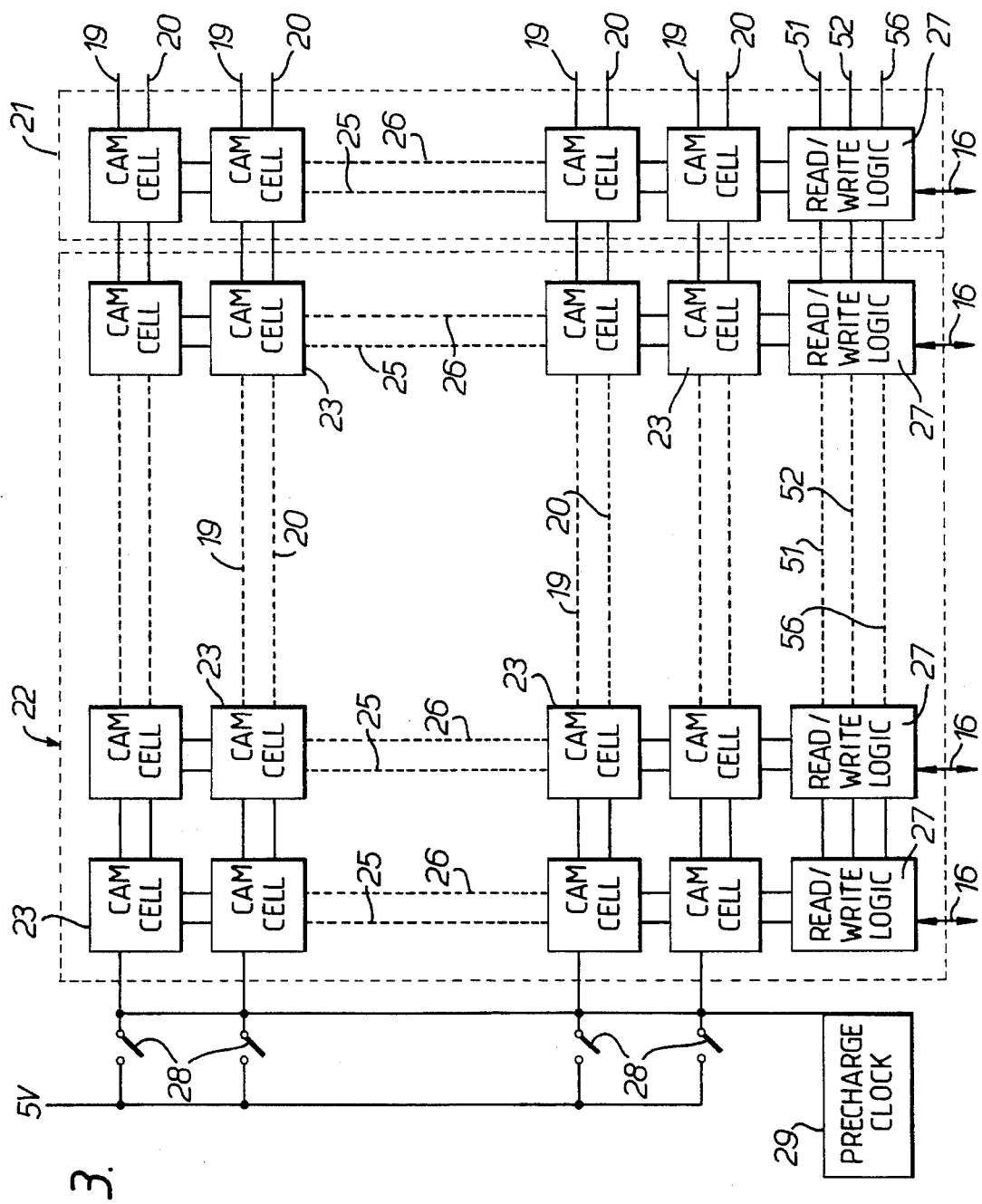
FIG. 3 shows further detail of the content addressable memory of FIG. 1.

Further detail of the arrangement shown in FIG. 1 is illustrated in FIG. 3. This figure illustrates the array 22 of CAM cells 23 in addition to the column of parity bit cells 21. As illustrated, in any particular row of cells all cells in the array 22 and parity bit column 21 are connected by a common word line 19 and a common match line 20. All cells in each column of the array 22 and in column 21 are connected by respective common bit and bit bar lines 25 and 26 to the respective read/write logic circuitry 27 for that column.

All match lines 20 are connected through switches 28 controlled by a precharge clock 29 to a precharging voltage line. In this way the match lines 20 may all be simultaneously precharged from the clock 29 when an associate operation is carried out by the read/write logic 27.

It will be appreciated that during an associate operation, the provision of a parity bit for each row in column 14 ensures that if a match does not occur for the data bits of that row when compared with the input data word at input 16, then the parity bit will also not match the parity bit which is input to the CAM. In this way any row where a mismatch occurs will have at least two RAM cells indicating a mismatch. These two cells will operate in parallel in discharging the match line to earth (as will be described below with reference to FIGS. 4 and 5). Although the addition of the parity bit increases the size of each stored word in a row to 33 bits, it ensures that the minimum difference between the input word and the stored word will always be at least two bits and consequently it provides double the rate of match signal development which more than compensates for the slight increase in the size of the CAM with consequent increase in parasitic capacitance and power dissipation which is caused by the addition of the parity bit column 21. In the case of a 32 bit data word CAM of the type shown in FIG. 1, the net effect of speed improvement may be $2 \times 32/33$ which equals 1.94. It will be appreciated that the increase in development of the match signal by the use of the parity bit is particularly effective when using long word lengths in the CAM.

Figure 2:
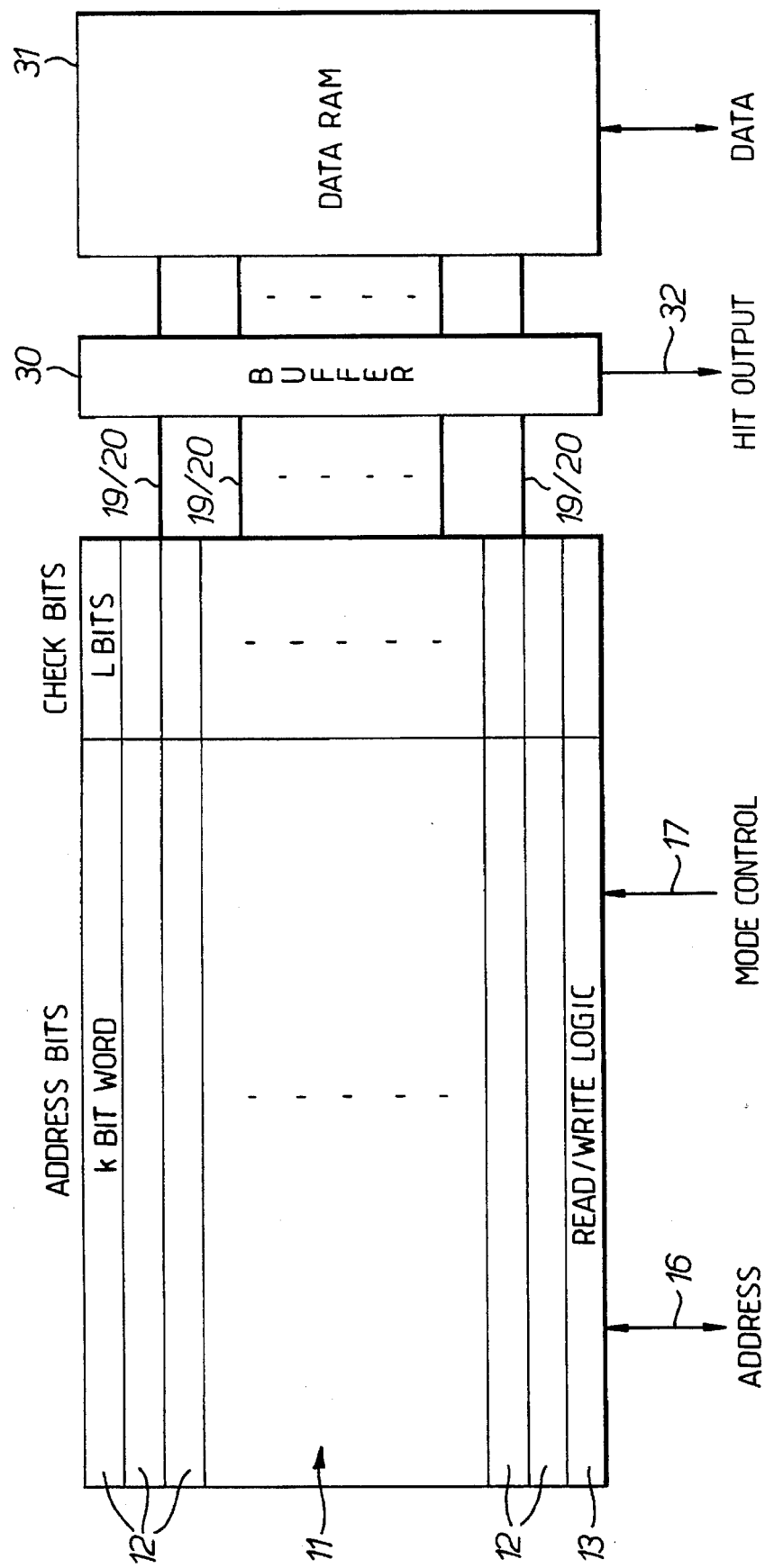
FIG. 2 is a block diagram of an alternative content addressable memory connected to a data RAM to form a cache memory.

FIG. 2 illustrates an alternative arrangement to that shown in FIG. 1. The CAM 11 is generally similar to that shown in FIG. 1 and similar reference numerals have been used. However in this case the match lines 20 forming an output from the CAM 11 are connected through a buffer 30 to a data RAM 31 thereby providing a cache memory. The data RAM 31 holds data in a conventional array of RAM cells in rows and columns.

Each row of cells in the data RAM 31 corresponds to a row in the CAM 11. During an associate operation, a data word representing an address or part of an address is input at 16 and compared with memory addresses or parts of memory addresses held in the array 11. If a match is found the appropriate match line 20 provides a signal through the buffer 30 which outputs a hit output 32 to indicate that the input address has been found in the cache and the buffer 30 energises the corresponding word line of the data RAM 31 so as to allow access to the corresponding row of cells in the data RAM 31.

In the particular example illustrated in FIG. 2 the column 14 of single parity bits for each row has been replaced by a plurality of check bits determined according to an error correcting code for the address bits of each row 12. In this particular example the address bits of each row are illustrated as an k bit word and the associated error correcting code used for each row of cells generates a plurality of check bits marked l bits which may typically comprise three or four bits. The generation of check bits for each row can be determined using standard error correcting code to encode the data for each row. The input 16 to the logic circuitry 13 will include check bits derived from use of the same standard error correcting code for the address bits of each input used during an associate operation.

The error correcting code may be used with codewords having a bit length n with k data bits and l check bits. Such codewords are known in systematic encoding rules, such as Hamming code rules, where two different codewords have a minimum Hamming distance which indicates the minimum number of places in which their bits differ. The encoding rule used will determine the minimum Hamming distance d between two code words. Some examples of (n,k) codes are given below.

EXAMPLE 1

The use of the parity bit in FIG. 1 would form a (33,32) code but a simple example with parity bits is a (4,3) code as follows:

| data | check bits | |
|------|-----------|---|
| 000  | 0         | where n = 4 |
| 001  | 1         | k = 3 |
| 010  | 1         | d = 2 |
| 011  | 0         | |
| 100  | 1         | |
| 101  | 0         | |
| 110  | 0         | |
| 111  | 1         | |

EXAMPLE 2—(6,3) code

| data | check bits | |
|------|-----------|---|
| 000  | 000       | where n = 6 |
| 001  | 110       | k = 3 |
| 010  | 101       | d = 3 |
| 011  | 011       | |
| 100  | 011       | |
| 101  | 101       | |
| 110  | 110       | |
| 111  | 000       | |

In Example 2 the checking bits, 4, 5 and 6 have values which meet the following conditions:
bit 4 is such that bit 2+bit 3+bit 4 have even parity
bit 5 is such that bit 1+bit 3+bit 5 have even parity
bit 6 is such that bit 1+bit 2+bit 6 have even parity EXAMPLE 3—(7,3) code

| data | check bits | |
|------|-----------|---|
| 000  | 0000      | where n = 7 |
| 001  | 1101      | k = 3 |
| 010  | 1011      | d = 4 |

-continued

| data | check bits |
|------|-----------|
| 011  | 0110 |
| 100  | 0111 |
| 101  | 1010 |
| 110  | 1100 |
| 111  | 0001 |

In the above examples the encoding system forms additional check bits which have bit locations different from the bits representing data. However, the invention may use encoding systems which input a data word to an encoder which generates an extended codeword having no separately identifiable check bits. The extended codeword has a bit length greater than the bit length of the input data word and a minimum Hamming distance greater than the input data word. In this way, the extended codeword is stored in a row of CAM cells using the data and check bit locations shown in FIGS. 1 and 2. The input data used in an associate operation is similarly input to an encoder which generates extended codewords representing the input data by use of the same encoding system.

Figure 4:
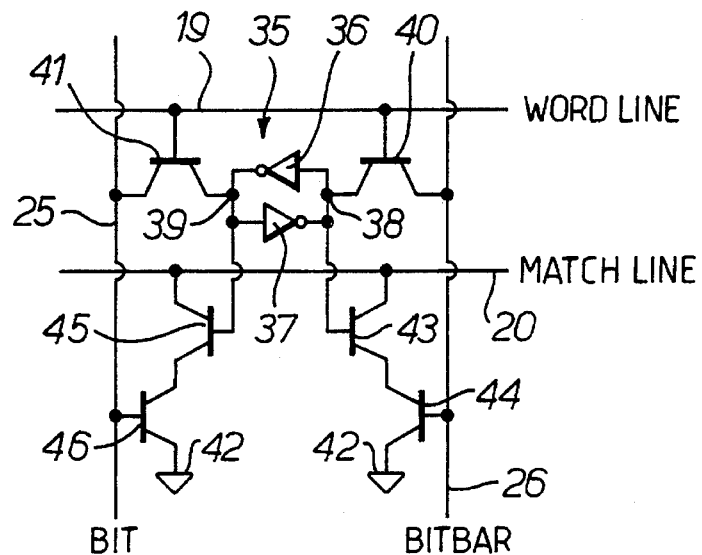
FIG. 4 shows the construction of a single cell for use in the embodiments of FIG. 1 or FIG. 2.
Figure 5:
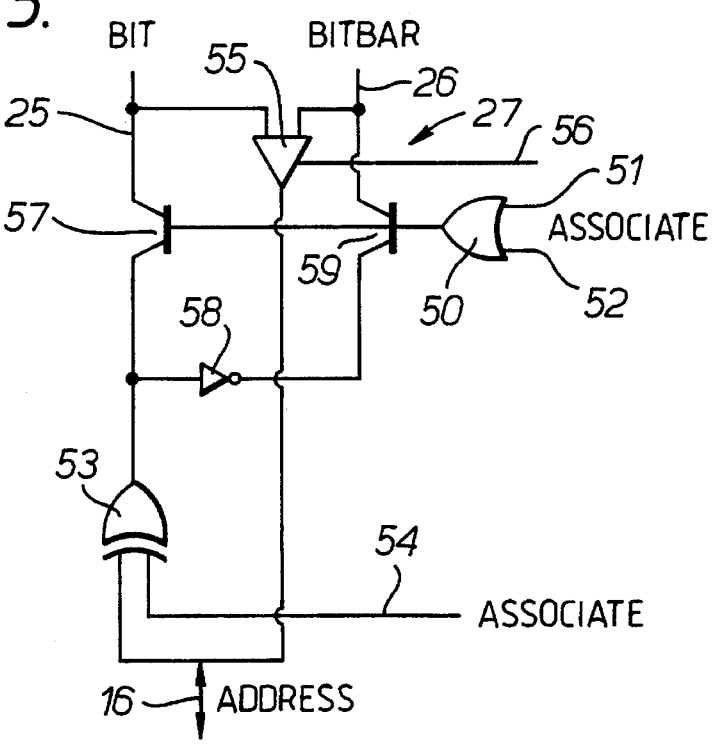
FIG. 5 shows further detail of read/write logic shown in FIG. 3.

The construction of the CAM cells 23 and the read/write logic 27 will now be described with reference to FIGS. 4 and 5. FIG. 4 shows the construction of each CAM cell 23. The cell consists of a latch 35 formed by two inverters 36 and 37 connected in parallel and in opposite directions between nodes 38 and 39. Node 38 is connected to the bit bar line 26 through a pass transistor 40 having its gate coupled to the word line 19. Similarly node 39 is connected to the bit line 25 through a pass transistor 41 having its gate coupled to the word line 19. The latch 35 operates in the manner of a conventional RAM cell in that when the word line 19 is charged the pass transistors 40 and 41 cause the latch 35 to adopt one of two stable states depending on the signals on lines 25 and 26 so that either node 38 is high with node 39 low or node 39 is high with node 38 low. To allow this cell to carry out the associate operation the match line 20 is precharged and each cell 23 may selectively discharge the match line to earth 42. Each cell provides two sets of series transistors to interconnect the match line 20 with earth 42. As shown in FIG. 4, two transistors 43 and 44 form one such connection to earth and two further transistors 45 and 46 provide a second series connection between the match line 20 and earth 42. Transistor 43 has its gate connected to node 38 so that it is turned on when node 38 is high. Transistor 44 has its gate connected to the bit bar line 26 so that this transistor is turned on when the signal on line 26 is high. Similarly transistor 45 has its gate connected to node 39 and is therefore turned on when node 39 is high. Transistor 46 has its gate connected to the bit line 25 and is turned on when the signal on line 25 is high. The match line 20 can in this way be discharged if the signals on lines 25 and 26 during an associate operation have values corresponding to those already stored in the cell 23. The control circuitry 27 for operating the cell 23 is shown in FIG. 5. Similar signal lines in FIG. 5 to those used in FIG. 4 have similar reference numerals. The control circuitry includes an OR gate 50 having inputs 51 and 52. An exclusive OR gate 53 has inputs on line 54 and the input 16. Input 51 is a write input. Inputs 52 and 54 are the same signal inputs and are used to cause an associate operation. Input 56 is a read input. The inputs 51,52,54 and 56 form the mode control 17 of FIGS. 1 and 2. A sense amplifier 55 controlled by signal line 56 receives inputs from the bit line 25 and bit bar line 26. The output of gate 53 is provided directly to the bit line 25 which includes a pass transistor 57. The output of gate 53 is also provided through an inverter 58 to the bit bar line 26 which includes in series a pass transistor 59. Transistors 57 and 59 are controlled by connecting their gates to the output of the OR gate 50. During a write operation the associate input 54 has a value 0 as does the read input 56. The write input has a value 1 and thereby causes the OR gate 50 to switch on the two transistors 57 and 59. The data to be stored is input at 16 and forms one input to the exclusive OR gate 53 which acts as a selectable inverter. While the associate input 54 has a value 0 gate 53 transmits the input from 16 with no inversion. When the associate input 16 has a value 1 gate 53 outputs with inversion the signal which is input at 16. Consequently during a write operation bit line 26 has the signal which is input at 16 and due to the inverter 58 the bit bar line 26 carries the inverse of the input at 16. By charging the appropriate word line 19 the values on lines 25 and 26 are thereby stored in the appropriate cell 23 causing the nodes 38 and 39 to take up values corresponding to those on the respective bit and bit bar lines 25 and 26. During a read operation, both inputs to the OR gate 50 are 0 causing the transistors 57 and 59 to be turned off. Charging of the required word line 19 causes stored values at nodes 38 and 39 to be transmitted through the bit and bit bar lines 25 and 26 to the amplifier 55 which thereby provides an output through 16 representing the value which was stored in the cell. During an associate operation the OR gate 50 is turned on as input 52 has the value 1 and input 51 has the value 0. This causes the two transistors 57 and 59 to be turned on. The input 54 to the exclusive OR gate 53 now has the value 1 which causes inversion by the gate 53 of any input at 16. This then causes the bit line 25 to have a signal which is the inverse of that input at 16 and bit bar line 26 has a signal which is the same as the input at 16. This is applied to the cells for which the match lines 20 are precharged. If the cell stores a value 1 represented by node 39 being high and 38 being low, an input of 1 during an associate operation will cause bit bar 26 to be high and bit 25 to be low. Although the high value on node 39 will switch on transistor 45 the low value on bit 25 will cause transistor 46 to be switched off preventing discharge of the match line 20 through transistor 46. Similarly the low value stored on node 38 will switch off transistor 43 thereby preventing discharge of the match line 20 through the transistors 43 and 44 although transistor 44 will be switched on by the high value on bit bar line 26. Consequently the match line 20 will not be discharged. If on the other hand the input at 16 represents a value 0 during an associate operation then the values on lines 25 and 26 will be reversed so that the value on line 25 will be high and the value on line 26 will be low. In this situation the match line 20 will be discharged as transistor 45 will be switched on by the stored high value at node 39 and the high value on line 25 will cause transistor 46 to be switched on thereby providing a discharge route between the match line 20 and earth 42. It will therefore be seen that during an associate operation cells 23 cause discharge of the match line 20 only when the input at 16 does not correspond with the stored information in the cell. Where correspondence is found the match line remains charged.

Figure 6:
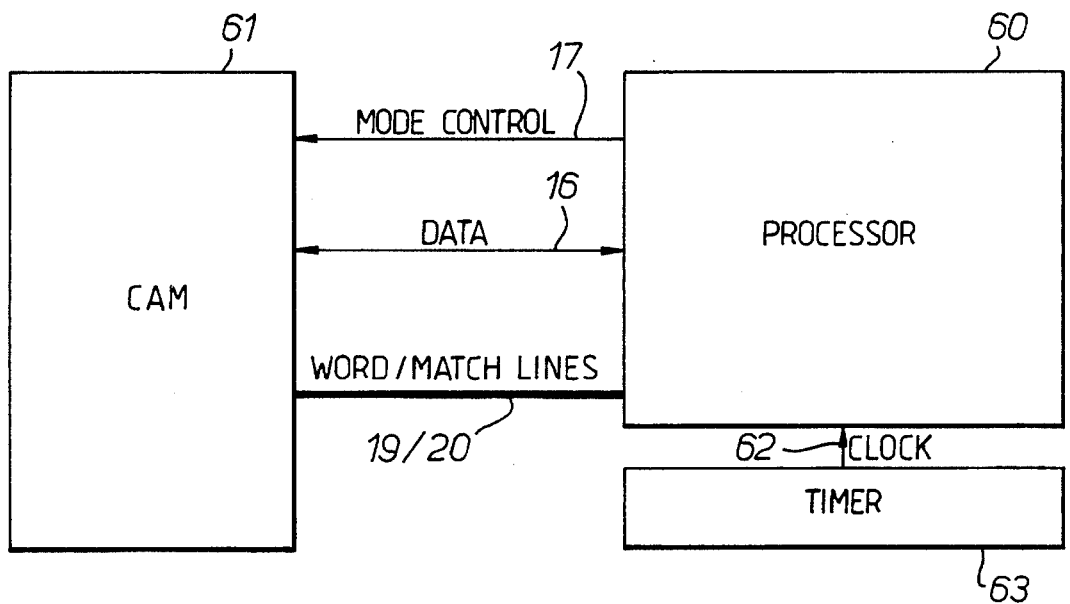
FIG. 6 is a block diagram of a system for operating a CAM of FIG. 1 or FIG. 2 at a high speed of access.
Figure 7:
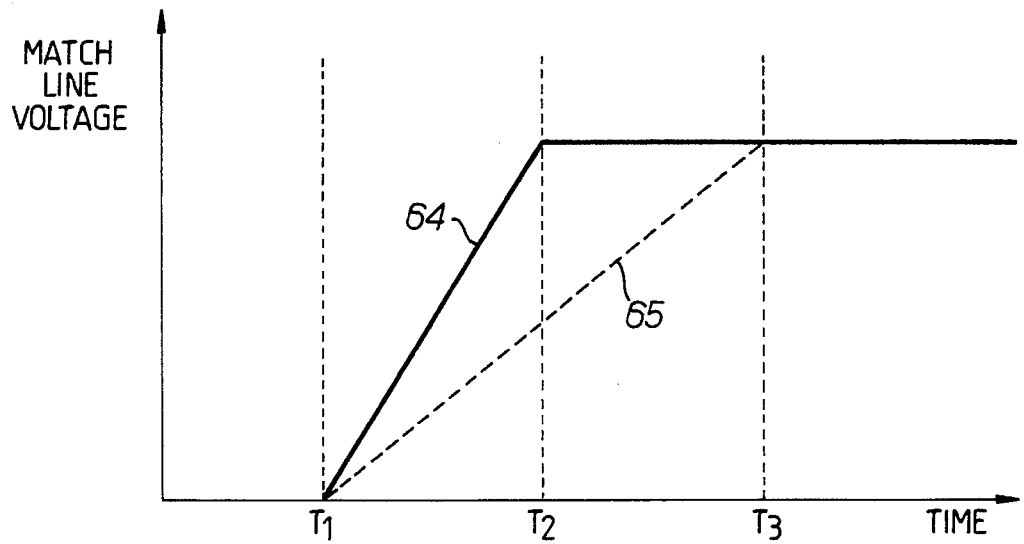
FIG. 7 is a timing diagram showing successive access operations of FIG. 6.

In FIG. 6 a processor system 60 is used to access the CAM 61 which may be similar to that of FIG. 1 or may form part of a cache memory as shown in FIG. 2. Similar reference numerals to those of FIGS. 1 and 2 have been used for corresponding inputs and outputs of the CAM 61. In this case the processor system 60 operates on timed cycles controlled by clock pulses 62 from a timer 63. The processor system 61 is set up to control the frequency of successive access operations to the CAM 61 so as to allow sufficient time for each access operation to cover the worst case of time delay for that operation. For association operations the processing system 60 will allocate a delay of clock pulses sufficient to allow change in signal level on a match line 20 for the worst case which occurs when a mismatch occurs at a single data bit location. FIG. 7 shows the time delays in change of signal level on a match line 20 for the present invention (line 64) and for a prior art CAM (line 65). When a data comparison is made during an association operation and a mismatch occurs, the voltage on the match line starts to change at $T_1$ in FIG. 7. In the prior art as shown by line 65, the rate of change may be relatively slow and it is only at time $T_3$ that the voltage has fully changed from a first state to a second state of a mismatch occurred in a single cell. Consequently the processor system 60 must allow delay between $T_1$ and $T_3$ before carrying out a next association operation. In the present invention, any mismatch will always involve at least two cells and so the slowest change in signal level occurs between $T_1$ and $T_2$ as shown in FIG. 7. This change in rate enables the processor system 60 to be arranged to access the CAM 61 at substantially twice the frequency of the prior art. In the above examples the processor system is set up to access the CAM at a frequency corresponding to any mismatch occurring at at least two cell locations. This frequency is higher than that which would be possible where the output of the CAM has to accommodate a mismatch at a single cell location.

The invention is not limited to the details of the foregoing exmaple.

In the above example each match line 20 is connected to precharge circuitry 29 to precharge the match line to a first signal level. When a mismatch occurs in a cell, the cell operates to discharge the match line. In an alternative, the match lines 20 may normally be discharged after connection to earth (the 5 volt line of FIG. 3 being replaced by earth). During an associate operation the discharged lines may be disconnected from earth by switching such as switches 28 and any mismatch cells may cause the match line to be charged up to a different signal level by replacing the earth connections 42 of FIG. 4 with a voltage supply such as a 5 volt line.

We claim:

1. A method of accessing a content addressable memory having a plurality of RAM cells connected in an array of rows and columns, each row having a plurality of cells for storing a data word, at least one additional cell for storing a checking bit and a match line for providing a signal to indicate when a match occurs between an input data word and data stored in a row of cells, which method comprises storing in at least one row of cells a data word in data cells of the row and a checking bit in said at least one additonal cell of the row, the checking bit having a value dependent on the content of the data word in accordance with an error checking system, and controlling a memory accessing system to effect an associate operation by inputting to the columns of cells an input word with an input checking bit dependent on said input word in accordance with the same error checking system, comparing the input word and input checking bit with stored contents of each row of cells and in any row where a mismatch of the input data word with the stored data word occurs causing at least two cells in that row to change a signal level on a match line for that row, said memory accessing system being arranged to operate with a time delay for each associate operation which is less than that required for a single cell mismatch.

2. A method according to claim 1 wherein each data word stored in the memory has a plural number of associated checking bits dependent on the data word in accordance with an error checking system and each input word which is input during an associate operation is provided with the same plural number of checking bits dependent on the input word in accordance with the same error checking system and during an associate operation the bits of an input word and its associated checking bits are compared with the respective contents of the data cells and cell storing checking bits in each row of the memory.

3. A method according to claim 1 in which the match line of each row in the memory is precharged before an associate operation and each cell in a row of cells operates to discharge said match line when a mismatch occurs in the cell during an associate operation.

4. A method according to claim 1 in which each match line is normally discharged and each cell is operable to charge the line when a mismatch occurs.

5. In a content addressable memory having an array of cells organized as a plurality of rows and columns, means for comparing data stored in the cells of each row with an input value, a match line associated with each row connected to the cells in the associated row, and a discharge circuit connected to each cell to discharge the match line if that cell does not match a corresponding bit of the input value, wherein the match line for each row is precharged to a first value prior to an associate operation, and, during an associate operation, is discharged to a second value through the discharge circuitry connected to all cells in each row which do not match the corresponding bits of the input value, the improvement comprising:

for each row, at least one additional cell having a value stored therein which is a function of the data stored in the cells of the row, wherein the function causes the additional cell to not match a corresponding additional bit in the input value when exactly one of the cells in the row, which store data, does not match its corresponding bit in the input value; and for each additional cell, a discharge circuit connected to the match line of the corresponding row to discharge the match line if that additional cell does not match the corresponding additional bit of the input value.

6. The content addressable memory of claim 5, wherein the at least one additional cell for each row comprises exactly one additional cell for each row.

7. The content addressable memory of claim 6, wherein the additional cell for each row is a parity bit containing parity data.

8. The content addressable memory of claim 5, wherein the at least one additional cell comprises a plurality of additional cells for each row.

9. The content addressable memory of claim 8, wherein the plurality of additional cells for each row are error correcting code bit positions, and contain error correcting code data for the data stored in the cells containing data.

* * * * *